United States Patent
Cyr et al.

(10) Patent No.: US 9,608,543 B2
(45) Date of Patent: Mar. 28, 2017

(54) TURN-OFF OVERVOLTAGE LIMITING FOR IGBT

(71) Applicant: TM4 INC., Boucherville (CA)

(72) Inventors: Jean-Marc Cyr, Candiac (CA);
Mohammed Amar, Montreal (CA);
Pascal Fleury, Sainte-Madeleine (CA);
Maalainine El Yacoubi, Montreal (CA)

(73) Assignee: TM4 INC., Quebec (CA)

( * ) Notice: Subject to any disclaimer, the term of this patent is extended or adjusted under 35 U.S.C. 154(b) by 411 days.

(21) Appl. No.: 14/363,439

(22) PCT Filed: Dec. 5, 2012

(86) PCT No.: PCT/CA2012/001125
§ 371 (c)(1),
(2) Date: Jun. 6, 2014

(87) PCT Pub. No.: WO2013/082705
PCT Pub. Date: Jun. 13, 2013

(65) Prior Publication Data
US 2014/0321178 A1  Oct. 30, 2014

Related U.S. Application Data

(60) Provisional application No. 61/567,800, filed on Dec. 7, 2011.

(51) Int. Cl.
*H02M 7/537* (2006.01)
*H03K 17/60* (2006.01)
(Continued)

(52) U.S. Cl.
CPC .............. *H02M 7/537* (2013.01); *H02M 1/08* (2013.01); *H02M 1/32* (2013.01);
(Continued)

(58) Field of Classification Search
CPC ........... H02M 1/08; H02M 2001/0029; H02M 2001/0048; H02M 2001/0054; H02M 1/15;
(Continued)

(56) References Cited

U.S. PATENT DOCUMENTS 6,320,362 B1    11/2001  Baek et al.
6,703,874 B2 *  3/2004   Katoh ..................... H02M 1/32
                                                          327/108
(Continued)

OTHER PUBLICATIONS

International Search Report and Written Opinion of PCT/2012/001125.
(Continued)

*Primary Examiner* — Jessica Han
(74) *Attorney, Agent, or Firm* — Venable LLP; Keith G. Haddaway

(57) ABSTRACT

A turn-off overvoltage limiting for IGBT is described herein. The injection of a sample of the overvoltage across the IGBT in the gate drive to slow down the slope of the gate voltage decrease only during the overvoltage above a predetermined value is described herein. Techniques to increase the parasitic inductance to allow the control to limit an overvoltage at turn off of the second IGBT are also described herein.

15 Claims, 9 Drawing Sheets

(51) Int. Cl.
  *H02M 1/08*   (2006.01)
  *H02M 1/32*   (2007.01)
  *H03K 17/082* (2006.01)
  *H03K 17/16*  (2006.01)
  *H02M 1/00*   (2006.01)
(52) U.S. Cl.
  CPC ....... *H03K 17/0828* (2013.01); *H03K 17/166* (2013.01); *H03K 17/60* (2013.01); *H02M 2001/0029* (2013.01)
(58) Field of Classification Search
  CPC .... H02M 1/32; H02M 1/34; H02M 2001/346; H02M 2001/348; H02M 2007/4811; H02M 7/519; H02M 7/521; H02M 7/537; H02M 7/538; H03K 17/0828; H03K 17/166; H03K 17/60; H03K 17/601; H03K 17/61
  See application file for complete search history.

(56) References Cited

U.S. PATENT DOCUMENTS

| | | | | |
|---|---|---|---|---|
| 7,315,439 B2* | 1/2008 | Muenzer | ................ | H02H 9/047 361/91.1 |
| 8,362,812 B2* | 1/2013 | Lee | ......................... | H02M 1/08 327/109 |
| 8,598,920 B2* | 12/2013 | Nakatake | ............. | H03K 17/168 327/109 |
| 2007/0195563 A1 | 8/2007 | Shiraishi et al. | | |
| 2008/0084642 A1 | 4/2008 | Kato et al. | | |
| 2012/0153719 A1* | 6/2012 | Inaba | ...................... | B60L 3/003 307/10.1 |
| 2012/0235663 A1* | 9/2012 | Bayerer | ................ | H02M 1/088 323/311 |
| 2015/0028923 A1* | 1/2015 | Peng | .................... | H03K 17/166 327/109 |
| 2015/0222202 A1* | 8/2015 | Cyr | .................... | H03K 17/0828 363/131 |
| 2016/0043711 A1* | 2/2016 | Cyr | ......................... | H02M 1/32 318/400.22 |
| 2016/0294275 A1* | 10/2016 | Pronovost | ........... | H03K 17/166 |
| 2016/0301308 A1* | 10/2016 | Amar | .................... | H03K 17/0828 |
| 2016/0308525 A1* | 10/2016 | Gonzalez Senosiain | ............... | H02M 1/08 |

OTHER PUBLICATIONS

Cyr et al., "Limiting the overshoot on IGBT during turn-OFF using stray inductance" International Conference and Exhibition, Automotive Power Electronics, Apr. 6-7, 2011, pp. 1-9.

Extended European Search Report for Application No. 12856190.9, dated Apr. 4, 2016.

* cited by examiner

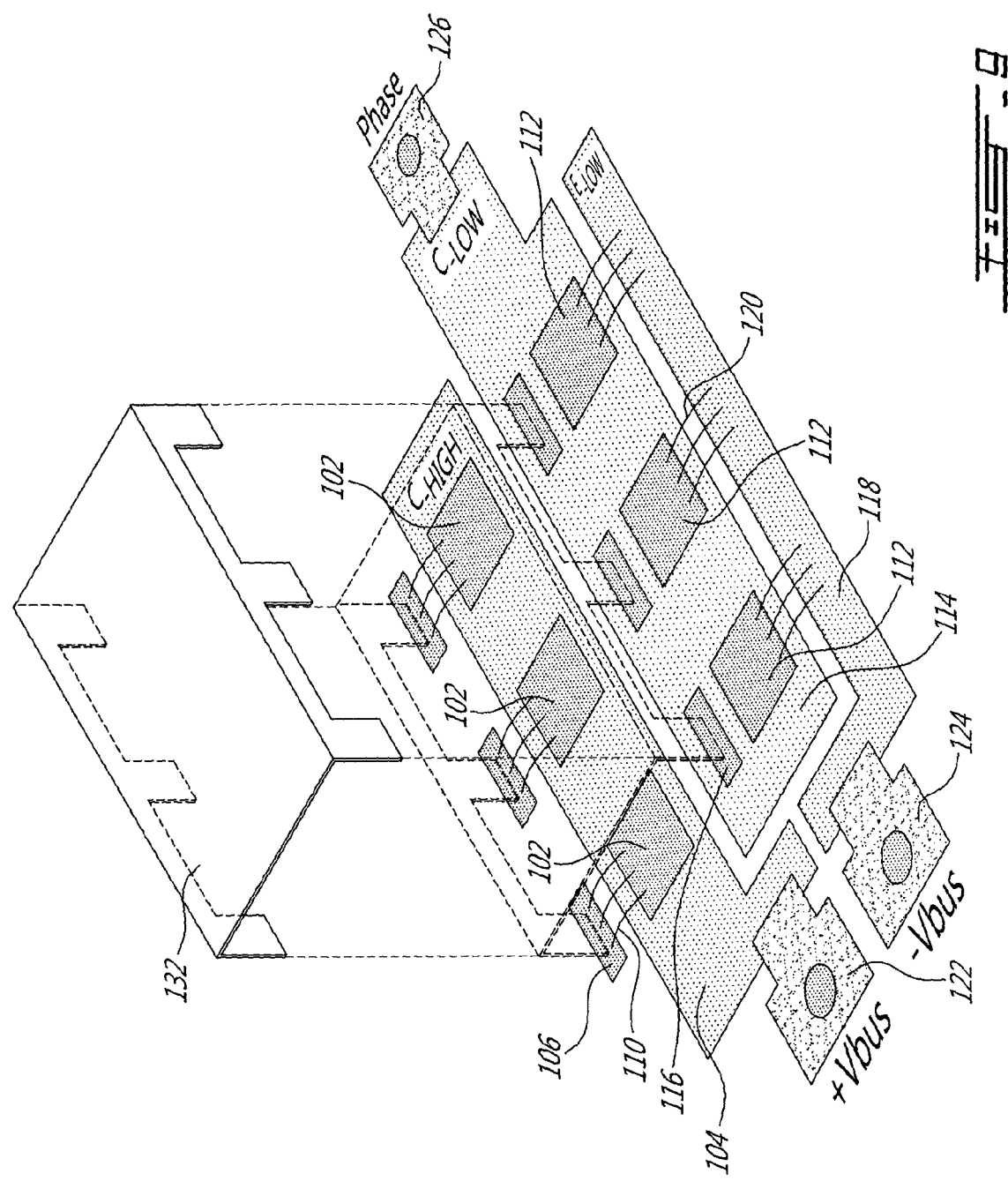

TURN-OFF OVERVOLTAGE LIMITING FOR IGBT

FIELD

The present disclosure generally relates to insulated gate bipolar transistors (IGBT). More specifically, the present disclosure is concerned with a configuration and a method to limit the turn-off overvoltage on the IGBTs to thereby improve their overall efficiency.

BACKGROUND

With the limited space allowed for the power inverter circuits in electric and/or electric hybrid automotive applications and the high cost of the semiconductors, the demand for integration of power electronics increases.

A known way of reducing the space occupied by the semiconductors in vehicles inverters is to increase their efficiency to allow the size of the cooling surface to be reduced.

The losses in IGBT modules present in conventional inverter designs are mainly caused by two sources; conduction losses and switching losses. One way to improve IGBT module switching losses is generally by accelerating the IGBT turn-on and turn-off. However, with faster IGBT turn-off, the overvoltage due to the stray inductance of the high-frequency loop increases so much that slow down of the turn-off is often required to protect the device, thereby seriously impacting the efficiency of the inverter.

BRIEF DESCRIPTION OF THE DRAWINGS

In the appended drawings:

FIG. 9 is another schematic layout for an IGBT module similar to the one of FIG. 8.

DETAILED DESCRIPTION

Figure 1:
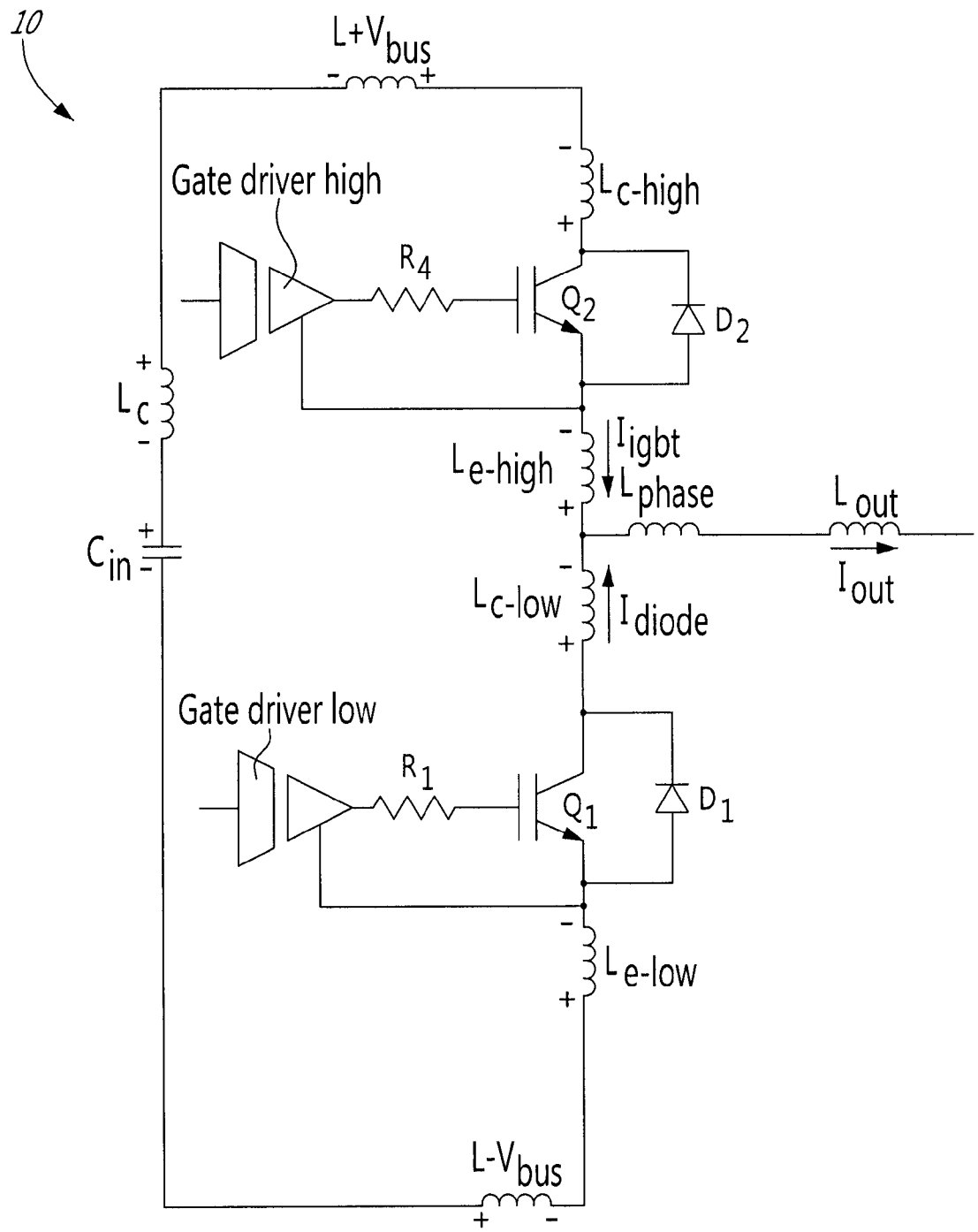
FIG. 1 is a circuit diagram of a typical gate drive IGBT configuration with the high frequency loop, illustrating the stray inductances and the logical connection where the gate drivers take their reference.

According to an illustrative aspect, there is provided a DC to AC power converter including first and second IGBTs each provided with a gate, a collector and an emitter, the gate of the each IGBT is connected to a gate driver including a reference; the gate driver reference of the first IGBT being connected to a ground bus of the power converter while the gate driver reference or the second IGBT being connected to the collector of the first IGBT; the parasitic inductance of the emitter of the second IGBT being increased to allow the control to limit an overvoltage at turn off of the second IGBT.

In accordance to another illustrative aspect, there is provided a DC to AC power converter including a first IGBT provided with a collector, an emitter, a gate and a gate driver including a reference and a second IGBT provided with a collector, an emitter, a gate and a gate driver including a reference, the power converter including:

first and second resistors connected in series and connected across a parasitic inductance of an emitter of the first IGBT; the gate driver reference of the first IGBT being connected to the connection point between the first and second resistor;

a transformer having a primary connected across the parasitic inductance of a collector of the second IGBT and a secondary connected to the parasitic inductance of an emitter of the second IGBT, the reference of the gate driver of the second IGBT being connected to the secondary of the transformer.

According to yet another illustrative aspect, there is provided a DC to AC power converter including a first IGBT provided with a collector, an emitter, a gate and a gate driver including a reference and a second IGBT provided with a collector, an emitter, a gate and a gate driver including a reference, the power converter including:

first and second resistors connected in series and connected across a parasitic inductance of the emitter of the first IGBT; the gate driver reference of the first IGBT being connected to the connection point between the first and second resistor;

a transformer having a primary connected across the parasitic inductance of the collector of the second IGBT and a secondary connected in series with the parasitic inductance of the emitter of the second IGBT, the gate driver reference of the second IGBT being connected to the secondary of the transformer.

The use of the word "a" or "an" when used in conjunction with the term "comprising" in the claims and/or the specification may mean "one", but it is also consistent with the meaning of "one or more", "at least one", and "one or more than one". Similarly, the word "another" may mean at least a second or more.

As used in this specification and claim(s), the words "comprising" (and any form of comprising, such as "comprise" and "comprises"), "having" (and any form of having, such as "have" and "has"), "including" (and any form of including, such as "include" and "includes") or "containing" (and any form of containing, such as "contain" and "contains"), are inclusive or open-ended and do not exclude additional, unrecited elements or process steps.

In the present specification and in the appended claims, various terminology which is directional, geometrical and/or spatial in nature such as "longitudinal", "horizontal", "front", "rear", "upwardly", "downwardly", etc. is used. It is to be understood that such terminology is used for ease of description and in a relative sense only and is not to be taken in any way as a limitation upon the scope of the present disclosure.

Other objects, advantages and features will become more apparent upon reading of the following non-restrictive description of illustrative embodiments thereof, given by way of example only with reference to the accompanying drawings.

The dI/dt at turn-off of the IGBT generates a voltage across the stray inductance of the high frequency loop that is applied across the IGBT above the bus voltage. Proposed herein is a solution based on the injection of a sample of the overvoltage across the IGBT in the gate drive to slow down the slope of the gate voltage to decrease the overvoltage only during the overvoltage period above a predetermined value.

FIG. 1, which is labeled prior art, discloses a third of a three-phase power converter 10 used, for example, in the powering of a three-phase electric motor (not shown) from a battery (also not shown).

Since this kind of converter is believed well known it will not be described in details herein. It is however to be noted that the inductances, inherently provided in the wires, connections, decoupling capacitor and circuit board traces, have been represented in FIG. 1.

As can be seen from FIG. 1, the reference of each gate driver is connected to the emitter, typically known as the logical pin, of a corresponding IGBT. For concision purpose, we will describe the bottom portion including the IGBT $Q_1$.

When the IGBT $Q_1$ is turned off, the current transit from Q1 to D2, the period of the overvoltage; the IGBT must be able to support the overvoltage created by the dI/dt across the various parasitic inductances ($L_c$, $L_{+bus}$, $L_{c-high}$, $L_{e-high}$, $L_{c-low}$ and $L_{c-low}$) that are present in the circuit. Indeed, since the inductances resist change of current therein, additive voltages develop in the circuit as can be seen by the polarity of the parasitic inductances illustrated in FIG. 1. These voltages added to the source voltage often result in a voltage that is often greater than the usual maximal voltage that may safely be present between the collector and the emitter ($V_{ce}$) of the IGBT.

Figure 2:
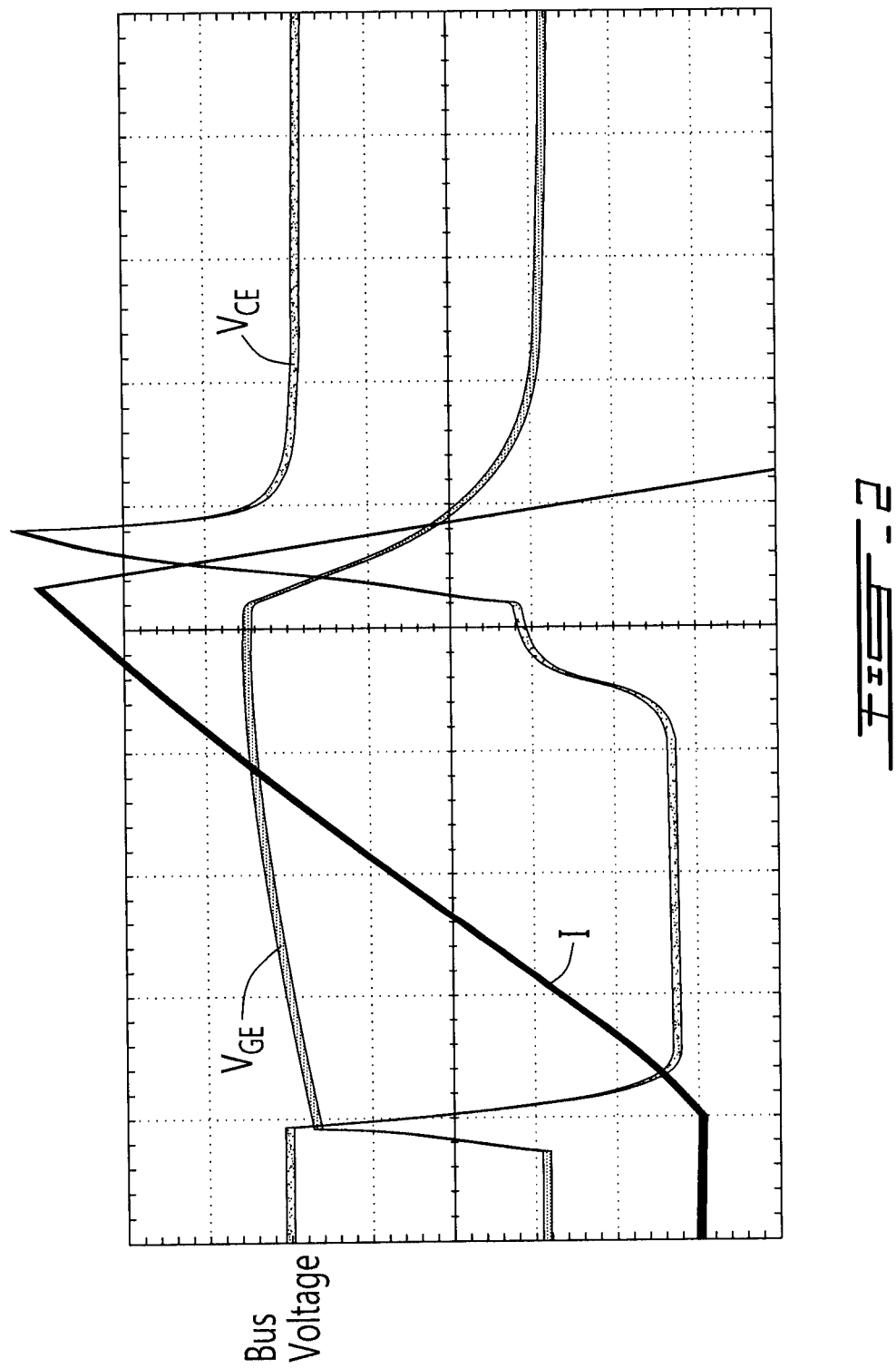
FIG. 2 is a diagram showing the current and voltage waveforms pointing out the overvoltage during short-circuit condition.

FIG. 2 illustrates $V_{ce}$, $V_{ge}$ and the current I at turn-off. One will notice that there is a major overvoltage of $V_{ce}$ above the bus voltage at the time of turn-off.

Generally stated, by changing the reference of the gate driver from the logical pin of FIG. 1 to the ground bus (for the bottom IGBT $Q_1$) and to the collector of the bottom IGBT (for the top IGBT $Q_2$), it is possible to decrease this overvoltage of $V_{ce}$ during turn-off.

In other words, a technique for connecting reference of the gate driver to the power tab of the IGBT instead of to the logical pin has been developed. The voltage across the emitter inductance is injected in the gate driver to create a negative voltage at the emitter of the IGBT to slow down the negative slope of $V_{ge}$, as will be discussed hereinbelow. The result is a direct action on the gate voltage without any delay and dI/dt limitations.

Because there is no optimal emitter inductance between the logical and power connections of the emitter in a commercial IGBT module, a technique has been developed to optimize the sample of the overvoltage injected in the gate drive circuit using a resistive divider.

Figure 3:
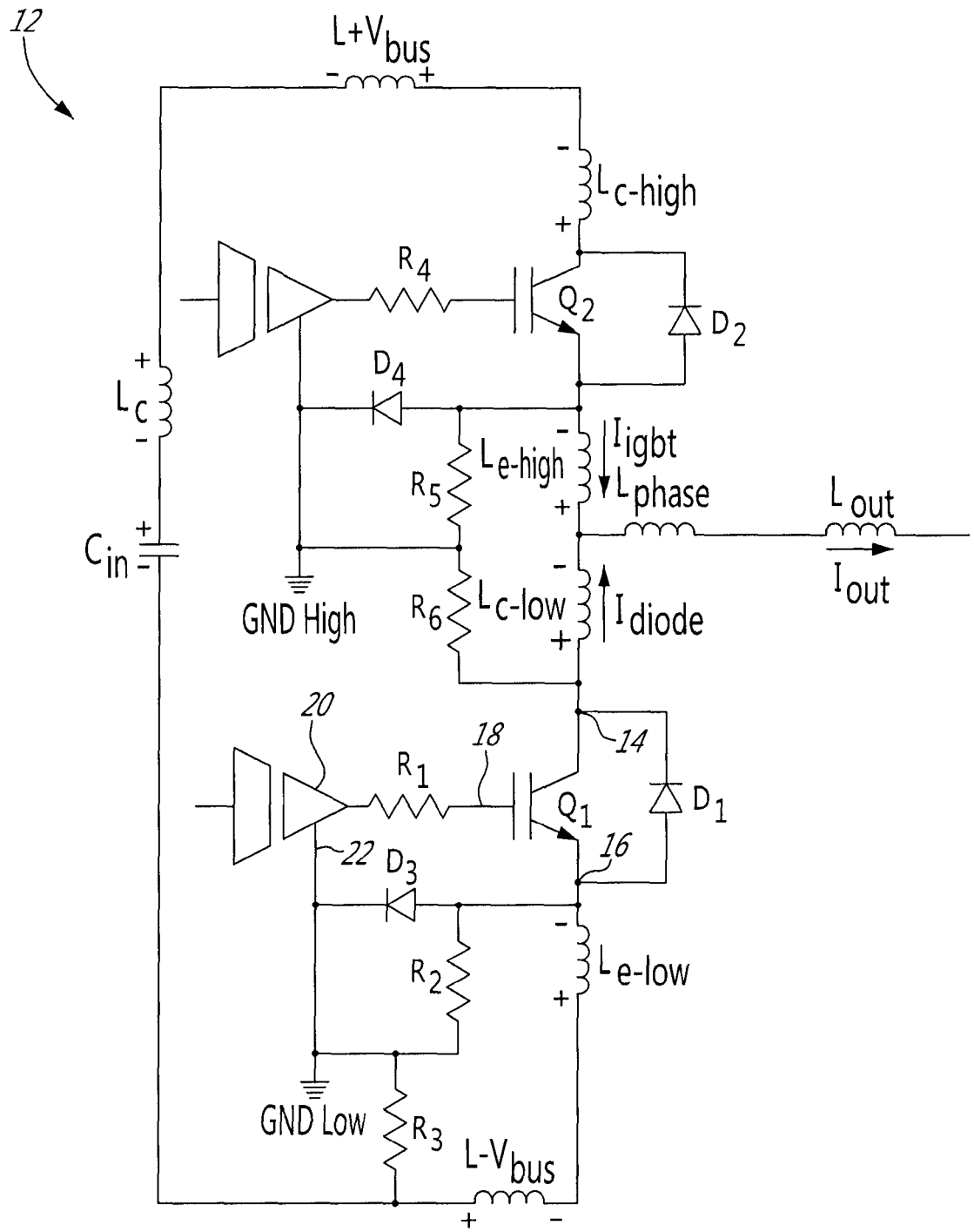
FIG. 3 is a circuit diagram of a gate drive IGBT reducing the overvoltage using a resistive divider connected across the emitter stray inductance, according to an illustrative embodiment.
Figure 4:
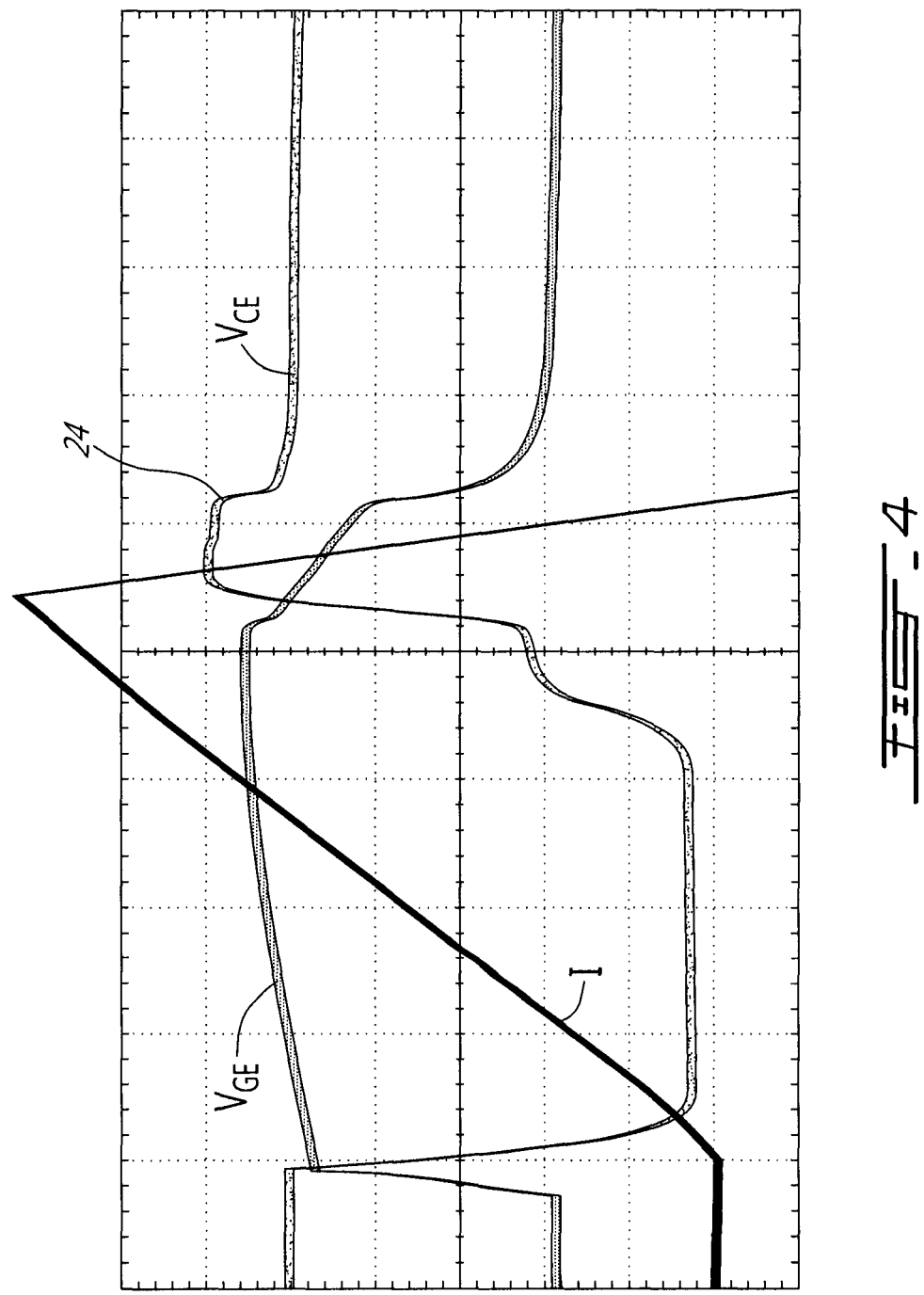
FIG. 4 is a diagram showing the turn-off waveforms of an IGBT using the resistive divider in short circuit condition with a bus voltage of 500V.

FIG. 3 shows the optimization of the overvoltage with a resistive divider technique and FIG. 4 the associated wave shape for a bus voltage as high as 500 Vdc.

Again, discussing the bottom portion of the three-phase power converter 12 of FIG. 3, the IGBT $Q_1$ includes a collector 14 having a parasitic inductance $L_{c-low}$, an emitter 16 having a parasitic inductance $L_{e-low}$ and a gate 18 connected to the gate driver 20 via a resistor $R_1$. The reference 22 of the gate driver 20 is connected to a resistive divider circuit including two resistors $R_2$ and $R_3$ and a diode $D_3$ that allows the turn-on not to be impacted.

The values of the resistors $R_2$ and $R_3$ are selected according to the level of overvoltage allowed across $Q_1$. FIG. 4 show the result of a resistive divider optimized for an operation at a bus voltage of 500 Vdc and FIG. 5 at a bus voltage of 300 Vdc. The ratio of $R_2$ over $R_3$ increases to reduce the overvoltage. The value of the two resistor in parallel is set, in series with $R_1$, as the gate driver resistor. This value of the gate resistor is adjusted according to the proper commutation behavior.

By setting the resistor values correctly, it is possible to reduce the effect of the emitter inductance to get the maximum overvoltage allowed to therefore improve the efficiency.

In other words, the normal practice consisting in using a resistor in the ground connection of the gate drive to limit the current in the diodes that protect the gate drive of the lower IGBT from a negative voltage when the upper IGBT turns off has been modified by splitting the resistor in two and adapt the ratio between them to limit the effect of the emitter inductance on the dI/dt. The total resistor remains the same but the voltage divider gives the desired weight of the emitter inductance to limit the overvoltage at the desired level.

The overvoltage should obviously be optimized as much as possible to reach the maximum IGBT rating; this is done by reducing the resistor connected to the logical emitters $R_3$ compared to the resistor connected to the power tab $R_2$. The voltage across the emitter inductance will be split in two and only the voltage across the logical resistor will be applied in the gate drive circuit to limit the gate voltage drop.

It is to be noted that while the resistors $R_2$ and $R_3$ are shown connected across both parasitic inductances $L_{e-low}$ and $L_{bus}$, they could be connected solely across parasitic inductance $L_{e-low}$ should this parasitic inductance be sufficient.

FIG. 4 shows the current I and the voltages $V_{ge}$ and $V_{ce}$ during turn-off for the circuit of FIG. 3. One skilled in the art will note that the overvoltage of $V_{ce}$ during turn-off is greatly reduced (see plateau 24). This plateau 24 occurs while the rate of drop of the voltage $V_{ge}$ is reduced by the insertion of the voltage from the parasitic inductance.

The duration of the plateau will impact greatly the losses during turn-off: the longer the plateau, the higher the losses. Because of the desire to limit at the same time the overvoltage and its length, a square wave shape of the overvoltage plateau is suitable. The intrinsic behavior (natural feedback) of the overvoltage gives this shape.

Figure 5:
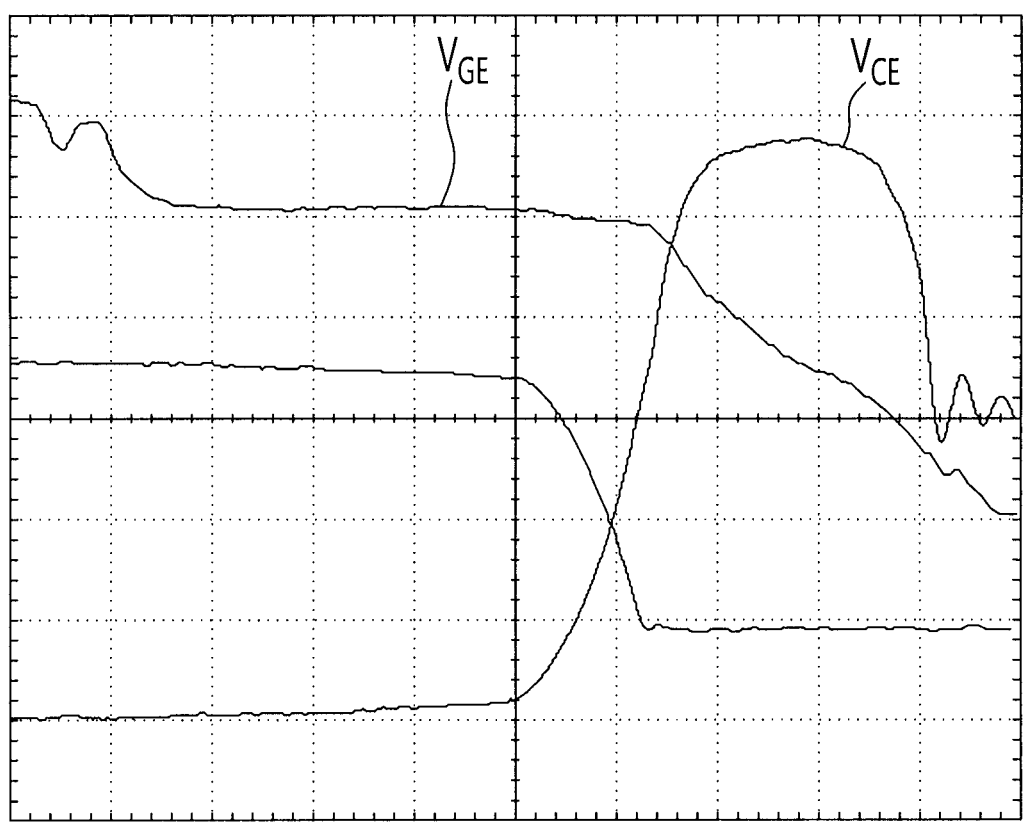
FIG. 5 is a diagram showing the turn-off waveforms of an IGBT using the resistive divider adjusted for a maximum bus voltage of 300V in short circuit condition.

FIGS. 4 and 5 show the square shape of the overvoltage when using the resistive divider at different bus voltages.

This technique works very well for the bottom IGBT because the emitter inductance is large enough but, for the top IGBT, the emitter inductance is often too small to suitably clamp the voltage without increasing the gate resistor to protect the device. In fact, in practice, the emitter inductance of the top IGBT is very often too low to be used to limit the overvoltage across the top IGBT at the desired level.

Indeed, because of the constraints on packaging of IGBT modules, the upper and lower semiconductors are packaged within close proximity of each other so the inductance of the upper IGBT, $L_{e-high}$, is quite small, in the order of a few nH. On the other hand, because the only point of connection other than the logical emitter of the lower IGBT is the power tab of −Vbus, the inductance of the lower IGBT, $L_{e-low}$, is 5 times the upper emitter inductance $L_{e-high}$. The connection of the −Vbus tab is highly inductive because of its length and curves.

In other words, all IGBT modules have two power connections, part of the high-frequency loop, that are the most inductive: +Vbus and −Vbus. Because −Vbus is in the path of the emitter of the bottom IGBT, it can be used to inject a sample of the overvoltage across the IGBT in the gate driver of the bottom IGBT. Unfortunately, since the +Vbus connection is connected to the collector of the top IGBT, this inductance cannot be used directly as a feedback in the gate driver.

To use Le-high as a feedback in the gate driver, it is therefore required to somehow increase its inductance without unduly increase the overall inductance of the high frequency loop. Two possible techniques to increase the $L_{e\text{-}high}$ inductance will be described hereinbelow.

In order to optimize the top IGBT turn-off, a first technique using the collector parasitic inductance to inject a sample of the overvoltage across the top IGBT using a transformer to isolate the collector from the emitter has been designed.

Figure 6:
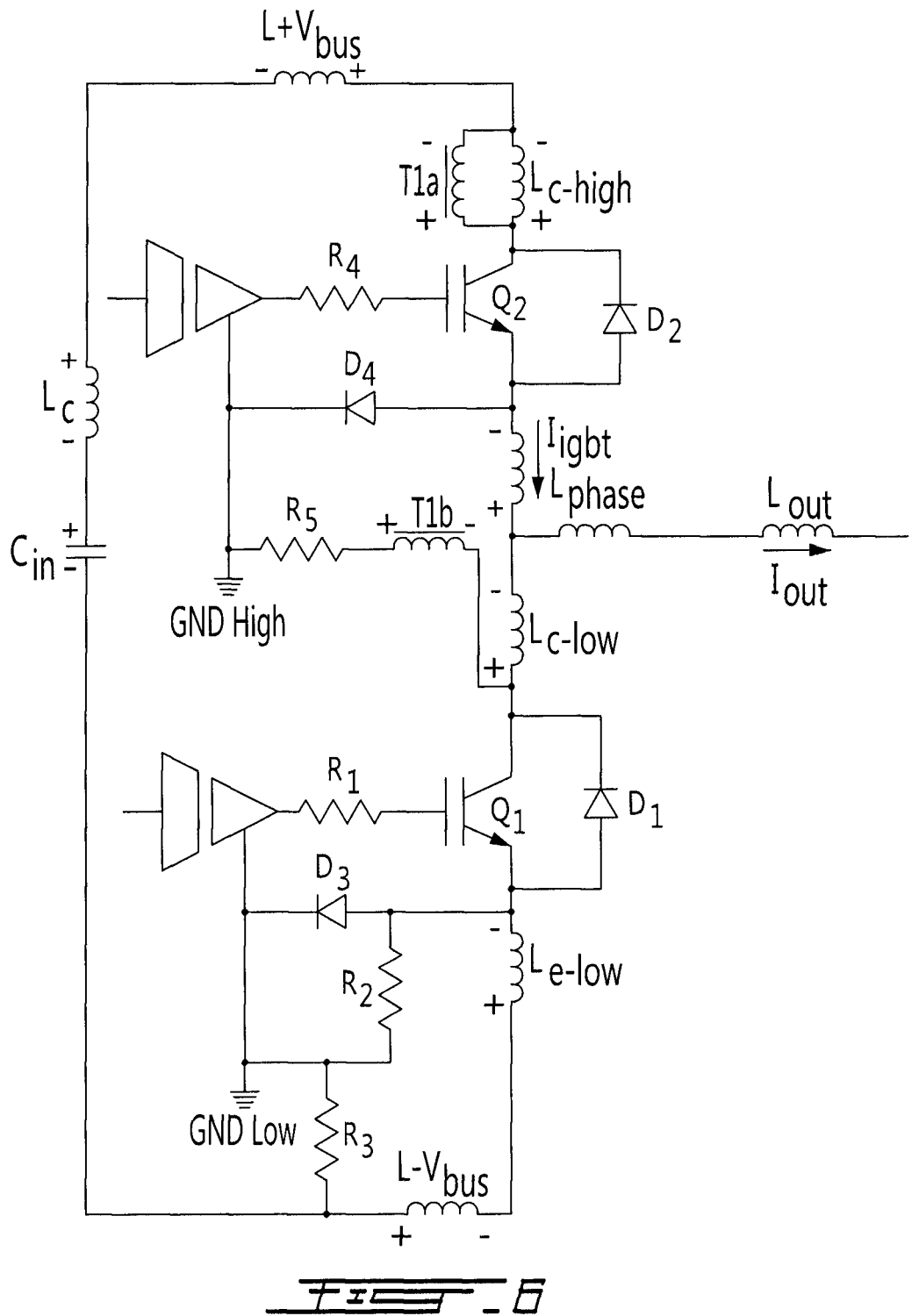
FIG. 6 is a circuit diagram of a drive IGBT reducing the overvoltage by using a transformer for the top IGBT according to another illustrative embodiment.

FIG. 6 shows the connections of the transformer. More specifically, the primary of the transformer T1a is connected across the $L_{c\text{-}high}$ parasitic inductance while the secondary of the transformer T1b is connected in series with the resistor $R_5$.

Therefore, a negative voltage appears across the transformer when the current decrease in the top IGBT that applies a negative voltage at the emitter to slow down the slope of the gate voltage. In that case, the optimization of the overvoltage is also performed by the turn ratio of the transformer.

It will be understood that the principle of operation of the circuit of FIG. 6 is very similar to the principle of operation of the circuit of FIG. 3, however, since the parasitic inductance of the emitter of the top IGBT $Q_2$ ($L_{e\text{-}high}$) is not enough to properly slow down the negative slope of $V_{ce}$ at turn-off, a sample of the parasitic inductance of the collector of the top IGBT $Q_2$ ($L_{c\text{-}high}$) is placed in series with $L_{e\text{-}high}$ through a transformer.

Figure 7:
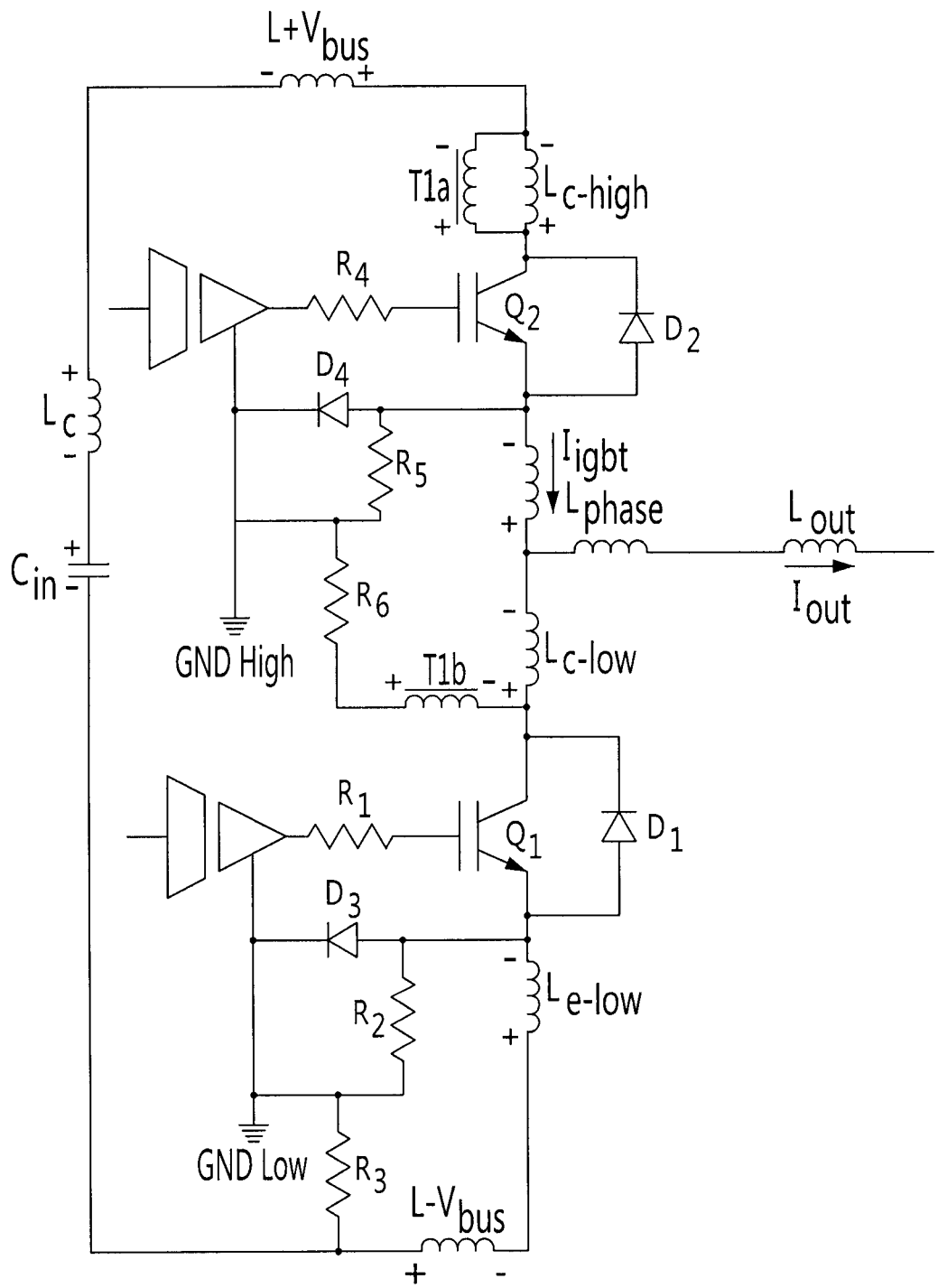
FIG. 7 is a circuit diagram of a drive IGBT reducing the overvoltage by using a transformer and a resistive divider according to another illustrative embodiment.

FIG. 7 of the appended drawings is a circuit diagram of an IGBT drive reducing the overvoltage by using a combination of a transformer and a resistive divider according to another illustrative embodiment. FIG. 7 illustrates a circuit similar to that of FIG. 6. The main difference between these circuits is concerned with a resistive divider including resistors $R_5$ and $R_6$ enabling the fine tune of the shape of the negative slope of the $V_{ge}$.

A second technique to increase the emitter inductance of the top IGBT Q2 will now be described with reference to FIGS. 8 and 9, which both illustrates variations of a layout of an IGBT module. These IGBT module layouts are used to make the circuit illustrated in FIG. 3 where, as will be explained hereinbelow, the parasitic inductance $L_{e\text{-}high}$ has been adjusted adequately.

One skilled in the art will understand that increasing the parasitic inductance of the upper IGBT may have an impact on the inductance of the total high frequency loop but its impacts on the control of the overvoltage is much more significant.

Figure 8:
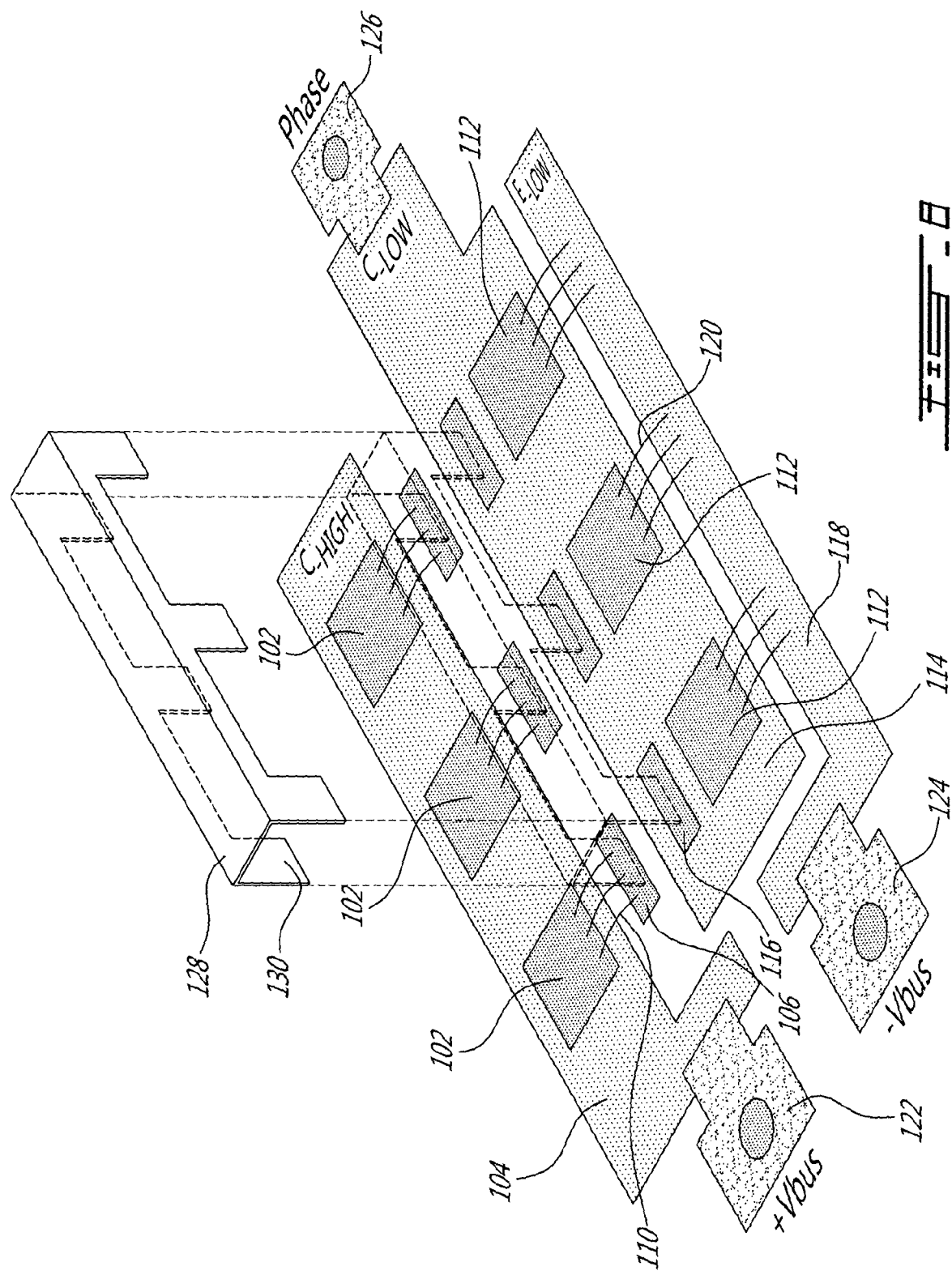
FIG. 8 is a schematic layout for an IGBT module where the emitted inductance of the top IGBT may be adjusted.

As can be seen from FIG. 8, the IGBTs 102 forming the IGBT Q2 have a collector mounted to a trace 104, the trace 104 therefore being referred to as C-High and their emitters are connected to emitter pads 106 via wire bonds 110. Similarly, the IGBT 112 forming the IGBT Q1 have a collector mounted to a trace 114 therefore being referred to as C-Low and their emitters are connected to a trace 118 via wire bonds 120, the trace 118 therefore being referred to as E-Low.

The trace 114 also has collector pads 116 that are connected thereto.

The +Vbus tab is connected to trace 104 while the −Vbus tab is connected to trace 118. The phase tab 126 is connected to trace 114.

It is to be noted that the gates of the IGBTs 102 and 112 are not illustrated in FIG. 8 for clarity purpose and since this figures is schematic.

The pads 106 and 116 are interconnected by a U-shaped connector 128 having six (6) legs 130 so configured, sized and positioned as to connect to the pads 106 and 116. One skilled in the art will understand that the U-shaped connector 128 defined the parasitic inductance $L_{e\text{-}high}$ since it interconnects the emitter of Q2 and the collector of Q1. Since the U-shape connector 128 is relatively large and includes right angles, the $L_{e\text{-}high}$ inductance is relatively high and can be used to limit the overvoltage in the IGBT Q2 as discussed hereinabove. It will also be understood that the size and shape of the connector 128 may be determined according to the desired parasitic inductance required.

Turning now briefly to FIG. 9, a similar layout for an IGBT module will be described.

Generally stated, the main difference between the layout of FIG. 8 and the layout of FIG. 9 is the position of the tabs 106 which are positioned farther away from the pads 110 to thereby allow a larger connector 132 and therefore a larger parasitic inductance $L_{e\text{-}high}$ to be used.

It is to be understood that the turn-off overvoltage limiting for IGBT is not limited in its application to the details of construction and parts illustrated in the accompanying drawings and described hereinabove. The turn-off overvoltage limiting for IGBT is capable of other embodiments and of being practiced in various ways. It is also to be understood that the phraseology or terminology used herein is for the purpose of description and not limitation. Hence, although the above description has been done by way of illustrative embodiments thereof, it can be modified, without departing from the spirit, scope and nature of the subject invention.

What is claimed is:

1. A DC to AC power converter including first and second IGBTs each provided with a gate, a collector and an emitter and a transformer having a primary connected across a parasitic inductance of the collector of the second IGBT and a secondary, the gate of the each IGBT is connected to a gate driver including a reference; the gate driver reference of the first IGBT being connected to a ground bus of the power converter while the gate driver reference of the second IGBT being connected to the collector of the first IGBT via the secondary of the transformer; the parasitic inductance of the emitter of the second IGBT being increased by the secondary of the transformer to allow the control to limit an overvoltage at turn off of the second IGBT.

2. The DC to AC power converter as recited in claim 1, wherein, for each IGBT, the gate driver includes first and second resistors connected in series and connected across a parasitic inductance of the emitter of the corresponding IGBT; the gate driver reference being connected to the connection point between the first and second resistors.

3. The DC to AC power converter as recited in claim 1, wherein the secondary of the transformer is connected in series with the parasitic inductance of the emitter of the second IGBT and the first and second resistors.

4. The DC to AC power converter as recited in claim 1, wherein the parasitic inductance of the emitter of the second IGBT is increased by providing a connector between the emitter of the second IGBT and the collector of the first IGBT, the connector being configured as to provide an increased equivalent parasitic inductance.

5. The DC to AC power converter as recited in claim 4, wherein the emitter of the second IGBT is connected to emitted pad and wherein the collector of the first IGBT is connected to collector pad; the connector being provided between the emitter pad and the collector pad.

6. The DC to AC power converter as recited in claim 5, wherein the emitter pad includes multiple emitter pads and wherein the collector pad includes multiple collector pads.

7. The DC to AC power converter as recited in claim 5, wherein the connector has a generally U-shaped cross section.

8. The DC to AC power converter as recited in claim 7, wherein the U-shaped connector includes legs so configured as to be interconnected with the pads.

9. A DC to AC power converter including a first IGBT provided with a collector, an emitter, a gate and a gate driver including a reference and a second IGBT provided with a collector, an emitter, a gate and a gate driver including a reference, the power converter including:
first and second resistors connected in series and connected across a parasitic inductance of an emitter of the first IGBT; the gate driver reference of the first IGBT being connected to the connection point between the first and second resistor;
a transformer having a primary connected across the parasitic inductance of a collector of the second IGBT and a secondary connected to the parasitic inductance of an emitter of the second IGBT, the reference of the gate driver of the second IGBT being connected to the secondary of the transformer.

10. The DC to AC power converter as recited in claim 9, wherein of the gate driver reference is connected to the secondary of the transformer via a third resistance.

11. A DC to AC power converter including a first IGBT provided with a collector, an emitter, a gate and a gate driver including a reference and a second IGBT provided with a collector, an emitter, a gate and a gate driver including a reference, the power converter including:
first and second resistors connected in series and connected across a parasitic inductance of the emitter of the first IGBT; the gate driver reference of the first IGBT being connected to the connection point between the first and second resistor;
a transformer having a primary connected across the parasitic inductance of the collector of the second IGBT and a secondary connected in series with the parasitic inductance of the emitter of the second IGBT, the gate driver reference of the second IGBT being connected to the secondary of the transformer.

12. The DC to AC power converter as recited in claim 11, wherein the secondary of the transformer is connected in series with both the parasitic inductance of the emitter of the second IGBT and a third and fourth resistors, the gate driver reference of the second IGBT being connected to the connection point between the third and fourth resistors.

13. A DC to AC power converter as recited in claim 12, wherein the secondary of the transformer is connected in series with the parasitic inductance of the emitter of the second IGBT, the parasitic inductance of the collector of the first IGBT and the third and fourth resistors.

14. A DC to AC power converter including a high frequency loop provided with:
bottom and top IGBTs each provided with a gate, a collector and an emitter, the gate of the each IGBT is connected to a gate driver including a reference; the gate driver reference of the bottom IGBT being connected to a ground bus of the power converter while the gate driver reference of the top IGBT being connected to the collector of the bottom IGBT;
a parasitic inductance defined by the interconnection of the various elements of the high frequency loop; the parasitic inductance of the emitter of the top IGBT and of the collector of the bottom IGBT being part of the parasitic inductance of the high frequency loop;
wherein a portion of a voltage induced in the parasitic inductance of the high frequency loop is added to a voltage induced in a parasitic inductance of the emitter of the top IGBT and of the collector of the bottom IGBT by a transformer to slow down the slope of the gate-emitter voltage (Vge) of the top IGBT, the transformer having a primary connected across a parasitic inductance of the high frequency loop and a secondary connected to the gate driver of the top IGBT in series with the parasitic inductance of the emitter of the top IGBT.

15. The DC to AC power converter as recited in claim 14, wherein, for each IGBT, the gate driver includes first and second resistors connected in series and connected across a parasitic inductance of the emitter of the corresponding IGBT; the gate driver reference being connected to the connection point between the first and second resistors.

* * * * *